US005495194A

United States Patent [19]

Sugawara

[11] Patent Number: 5,495,194

[45] Date of Patent: Feb. 27, 1996

[54] HIGH FREQUENCY MULTIPLIER

[75] Inventor: Hideo Sugawara, Kawasaki, Japan

[73] Assignee: Fujitsu Limited, Kawasaki, Japan

[21] Appl. No.: 273,788

[22] Filed: Jul. 12, 1994

[30] Foreign Application Priority Data

Nov. 5, 1993 [JP] Japan .................................... 5-276846

[51] Int. Cl.$^6$ ................................ G06G 7/12; H04B 1/26

[52] U.S. Cl. .......................... 327/113; 327/116; 327/359; 327/355; 327/356; 455/333

[58] Field of Search .................................... 327/108, 116, 327/355, 356, 357, 359, 52, 113, 350; 455/326, 330, 333

[56] References Cited

FOREIGN PATENT DOCUMENTS

| | | | |
|---|---|---|---|
| 0316999 | 5/1989 | European Pat. Off. | 455/333 |
| 2850778 | 5/1979 | Germany | 455/333 |
| 48-20932 | 6/1973 | Japan . | |
| 0274105 | 11/1990 | Japan | 455/333 |

*Primary Examiner*—Timothy P. Callahan
*Assistant Examiner*—Dihn T. Le
*Attorney, Agent, or Firm*—Armstrong, Westerman, Hattori, McLeland & Naughton

[57] ABSTRACT

A high frequency multiplier for use in modulation/demodulation circuits, frequency converters or the like. The high frequency multiplier is used at high frequency band, and has a simplified configuration. The high frequency multiplier is formed of a pair of first transistor and a second transistor which are connected differentially to each other; a pair of third and fourth transistors which are connected differentially to each other; a constant current source connected to emitters or sources of the first and second transistors; an impedance circuit connected between a node at which the collector or drain of the first transistor is connected to the emitter or source of the third transistor and a node at which the collector or drain of the second transistor is connected to the emitter or source of the fourth transistor; and a load impedance circuit connected to the collectors or drains of the third and fourth transistors. The third transistor or fourth transistor receives a first input signal at the base or gate, and the first transistor or second transistor receives a second input signal at the base or gate. An output signal having product information of the first input signal and the second input signal is outputted from the node at which the collectors or drains of the third and fourth transistors are connected to the load impedance circuit.

7 Claims, 7 Drawing Sheets

Vcc
Rc2
Rc1
OUTPUT SIGNAL
SECOND INPUT SIGNAL
FIRST INPUT SIGNAL
Q11
Q12
Q13
Q14
Q15
Q16
CC

HIGH FREQUENCY MULTIPLIER

BACKGROUND OF THE INVENTION

1) Field of the Invention

The present invention relates to a high frequency multiplier suitable for the use in modulation/demodulation circuits, frequency converters, and the like.

2) Description of the Related Art

Various multipliers each of which outputs a product of two signals have been proposed. For example, Japanese Patent Publication No. 48-20932 discloses a typical multiplier.

FIG. 12 is an electrical circuit diagram showing an example of a balanced input-type multiplier. Referring to FIG. 12, the multiplier includes a pair of first and second transistors Q11 and Q12 connected differentially to each other, a pair of third and fourth transistors Q13 and Q14 connected differentially to each other, and a pair of fifth and sixth transistors Q15 and Q16.

A constant current CC is connected to the emitters of the first and second transistors Q11 and Q12. A load resistor Rc2 is connected to the collectors of the third and fifth transistors Q13 and Q15. A load resistor Rc1 is connected to the collectors of the fourth and sixth transistors Q14 and Q16. A first input signal is inputted to the bases of the third to sixth transistors Q13 to Q16. A second input signal is inputted to the bases of the first and second transistors Q11 and Q12. A first output signal having product information of the first input signal and the second input signal is outputted from the node at which the load resistor Rc2 is connected to the collectors of the third and fifth transistors Q13 and Q15 while a second output signal having product information of the first input signal and the second input signal is outputted from the node at which the load resistor Rc1 is connected to the collectors of the fourth and sixth transistors Q14 and Q16.

That is, when the first input signal is A cos $\omega 1t$ and the second input signal is B cos $\omega 2t$, the multiplier outputs an output signal of $K \cdot A \cos \omega 1t \cdot B \cos \omega 2t$, where A and B are an amplitude, respectively, $\omega 1$ and $\omega 2$ are an radian frequency, respectively, t is time, and K is a constant.

Since the output signal, $K \cdot A \cos \omega 1t \cdot B \cos \omega 2t$, is $(1/2) K \cdot A \cdot B \{\cos(\omega 1 - \omega 2)t + \cos(\omega 1 + \omega 2)t\}$, both a signal of $(\omega 1 + \omega 2)$ and a signal of $(\omega 1 - \omega 2)$ are outputted as an output signal, respectively, whereby an output amplitude is determined by a constant K.

However, there is a disadvantage in that the multiplier described above, which is basically formed of 6 transistors, causes its large circuit scale, thus resulting in increased current consumption and complicated wiring. Particularly, since many cross connections included in the multiplier cause unnecessary coupling, the multiplier cannot have good characteristics in higher frequency band.

SUMMARY OF THE INVENTION

The present invention is made to overcome the above mentioned problems. An object of the present invention is to provide a high frequency multiplier that is used suitably in high frequency band and has its simplified configuration.

In order to achieve the above objects, according to the present invention, the high frequency multiplier is characterized by a pair of first transistor and a second transistor which are connected differentially to each other; a pair of third transistor and a fourth transistor which are connected differentially to each other; a constant current source connected to emitters or sources of the first and second transistors; the first transistors having a collector or drain connected to an emitter or source of said third transistor, and the second transistors having a collector or drain connected to an emitter or source of said fourth transistor; an impedance circuit connected between a node at which the collector or emitter of the first transistor is connected to the emitter or source of the third transistor and a node at which the collector or emitter of the second transistor is connected to the emitter or source of the fourth transistor; and a load impedance circuit connected to the collectors or drains of the third and fourth transistors; the third or fourth transistor receiving a first input signal at the base or gate; the first or second transistor receiving a second input signal at the base or gate; whereby an output signal having product information of the first input signal and said second input signal is outputted from the node connected between the collectors or drains of the third and fourth transistors and the load impedance circuit.

As described above, the high frequency multiplier, which is formed of four transistors, can be realized in a simplified circuit structure. Hence, there is an advantage in that a frequency converter, a radio communication apparatus or the like each employing the present invention can be led to miniaturization, low price, high performance, and low power consumption.

In this case, the impedance circuit can be formed so as to exhibit a low impedance at a frequency of said first input signal and exhibits a high impedance at a frequency of said second input signal.

The pair of the third and fourth transistors form a differential circuit for a first input signal. The pair of the first and second transistors form a differential circuit for the second input signal. Hence there is an advantage in that the circuit structure can output surely an output signal having product information of the first input signal and the second input signal from the node at which the collectors or drains of the third and fourth transistors is connected to the load impedance circuit.

It is desirable that the impedance circuit exhibits an electrostatic capacitance when the second input signal has a frequency lower than that of the first input signal. This feature leads advantageously to an integrated circuit fabrication.

Furthermore, it is desirable that the impedance circuit exhibits an inductance when the second input signal has a frequency higher than that of the first input signal. This feature can suitably realize a high frequency multiplier on a printed board.

The impedance circuit can be formed of a serial resonance circuit that resonates at a frequency of the first input signal. The impedance circuit can be formed of a parallel resonance circuit that resonates at a frequency of the second input signal. This feature can operate certainly a down-converter used in a radio receiver that receives two input signals each having a close frequency.

The impedance circuit may be a resistor. This feature can realize advantageously a high frequency multiplier at low manufacturing cost.

DESCRIPTION OF THE PREFERRED EMBODIMENTS

Referring to the attached drawings, explanation will be made in detail as for preferred embodiments according to the present invention.

Figure 1:
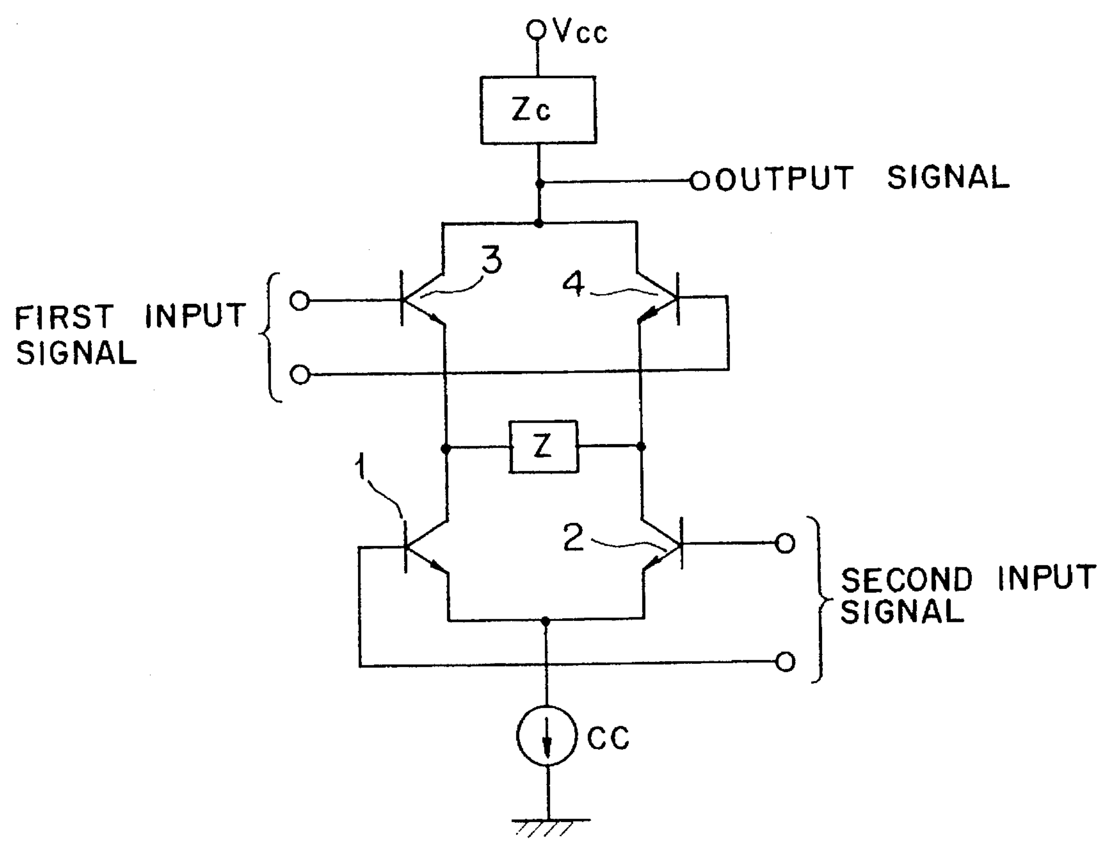
FIG. 1 is a diagram used for explaining an aspect of the present invention.

(a) The aspect of the invention:

FIG. 1 is a circuit diagram showing an aspect of the present invention. Referring to FIG. 1, a high frequency multiplier is formed of a pair of a first transistor 1 and a second transistor 2 which are connected differentially to each other; a pair of third transistor 3 and a fourth transistor 4 which are connected differentially to each other; a constant current source CC connected to emitters or sources of the first and second transistors 1 and 2; the first transistor 1 having a collector or drain connected to an emitter or source of said third transistor 3, and the second transistor 2 having a collector or drain connected to an emitter or source of said fourth transistor 4; an impedance circuit Z connected between a node at which the collector or drain of the first transistor 1 is connected to the emitter or source of the third transistor 3 and a node at which the collector or drain of the second transistor 2 is connected to the emitter or source of the fourth transistor 4; and a load impedance circuit Zc connected to the collectors or drains of the third and fourth transistors 3 and 4; the third or fourth transistor 3 or 4 receiving a first input signal at the base or gate; the first or second transistor 1 or 2 receiving a second input signal at the base or gate; whereby an output signal having product information of the first input signal and said second input signal is outputted from the node at which the collectors or drains of the third and fourth transistors 3 and 4 are connected to the load impedance circuit Zc.

The impedance circuit Z can be desirably formed so as to exhibit a low impedance at a frequency of said first input signal and exhibits a high impedance at a frequency of said second input signal.

Figure 2:
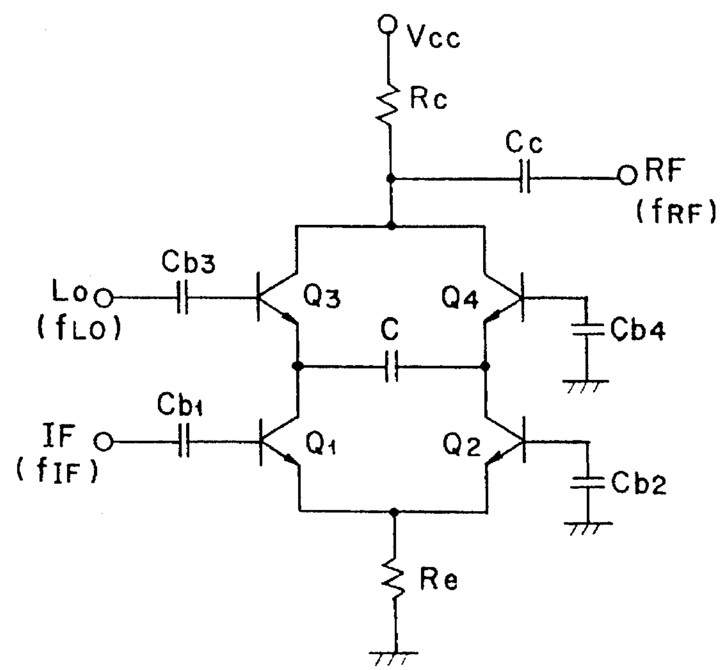
FIG. 2 is an electrical circuit showing the first embodiment according to the present invention.

An electrostatic capacitance C is used as the impedance circuit Z when the second input signal has a frequency lower than that of the first input signal, as shown in FIG. 2.

Figure 3:
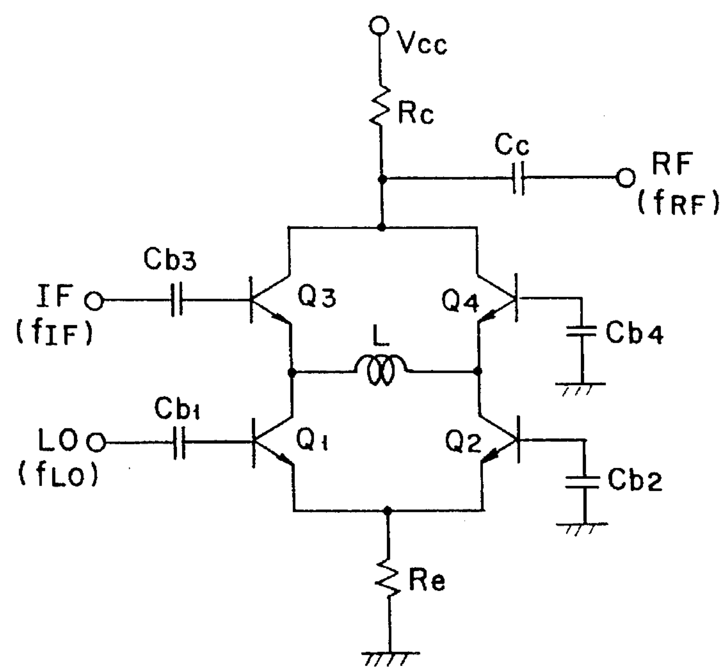
FIG. 3 is an electrical circuit showing a first modification of the first embodiment according to the present invention.

An inductance L is used as the impedance circuit Z when the second input signal has a frequency higher than that of the first input signal, as shown in FIG. 3.

A serial resonance circuit that resonates at a frequency of the first input signal is used as the impedance circuit Z. A parallel resonance circuit that resonates at a frequency of the second input signal is used as the impedance circuit Z. A resistor can be used as an impedance circuit Z.

In the high frequency multiplier according to the present invention, a first input signal is inputted to the base or gate of the third or fourth transistor 3 or 4 while a second input signal is inputted to the base or gate of the first or second transistor 1 or 2. In a fundamental operation, the impedance circuit Z shows a low impedance at a first input signal and shows high impedance at a second input signal. Hence, both the third transistor 3 and the fourth transistor 4 form a differential circuit for a first input signal. Both the first transistor 1 and the second transistor 2 form a differential circuit for a second input signal. An output signal having product information of the first and second input signals is outputted from the node connected between the load impedance circuit Zc and the collectors or drains of the third and fourth transistors 3 and 4.

According to the present invention, a high frequency multiplier that is formed of four transistors can be realized in a simple circuit structure. Hence, there is an advantage in that the high frequency multiplier can contribute to miniaturization, low price, high performance, and low power consumption of a frequency converter, a radio communication apparatus or, the like each embodied with this invention.

As described above, the impedance circuit is formed so as to exhibit a low impedance at the first input signal and a high impedance at the second input signal. Hence, the third transistor 3 and the fourth transistor 4 form a differential circuit for the first input signal. The first transistor 1 and the second transistor 2 form a differential circuit for the second input signal. An output signal having product information of the first input signal and the second input signal can be outputted certainly from the node connected between the collectors or drains of the third and fourth transistors 3 and 4 and the load impedance circuit.

Furthermore, there is an advantage in that since the impedance circuit is formed as an static electric capacitance when the second input signal has a frequency lower than that of the first input signal. This circuit structure facilitates an integrated circuit fabrication.

When the second input signal has a frequency higher than that of the first input signal, the impedance circuit is formed as an inductance. Hence, this feature allows the high frequency multiplier to be realized on a printed board.

Moreover, by forming the impedance circuit with either a serial resonance circuit that resonates at the frequency of the first input signal or a parallel resonance circuit that resonates at the frequency of the second input signal, a certain operation can be established even when two input signals used for a down-converter in a radio receiver have a close frequency to each other.

There is an advantage in that forming the impedance circuit with a resistor allows the high frequency multiplier to be realized at a low manufacturing cost.

(b) Explanation of First Embodiment:

Detail explanation will be made below with reference to the attached drawing. FIG. 2 is an electrical circuit diagram showing the first embodiment according to the present invention. Referring to FIG. 2, a high frequency multiplier is used for an up-converter (transmission frequency converter) in a transmitter. A local signal (hereinafter, referred to an L0 signal) of a frequency of $f_{LO}$ is inputted as a first input signal while an intermediate frequency signal (hereinafter, referred to an IF signal) of a frequency of $f_{IF}$ is inputted as a second input signal. In this case, a radio frequency signal (hereinafter, referred to RF signal) of a frequency of $f_{RF}$ ($f_{LO}+f_{IF}$) or ($f_{LO}-f_{IF}$) is outputted as an output signal. For example, when the frequency $f_{LO}$ of the Lo signal is 800 MHz and the frequency $f_{IF}$ of the IF signal is 40 MHz, $f_{LO}>f_{IF}$.

In order to realize the operation described above, the circuit configuration includes a pair of the first and second transistors Q1 and Q2 connected differentially to each other, and a pair of the third and fourth transistors Q3 and Q4 connected differentially to each other.

A resistor Re acting as a constant current source is connected to the emitters of the first and second transistors Q1 and Q2. The first transistor Q1 has the collector connected to the emitter of the third transistor Q3. The second transistor Q2 has the collector connected to the emitter of the fourth transistor Q4.

A capacitor (electrostatic capacitance) C is connected as an impedance circuit between the node connecting the collector of the first transistor Q1 and the emitter of the third transistor Q3 and the node connecting the collector of the second transistor Q2 and the emitter of the fourth transistor Q4.

A resistor Rc is connected as a load impedance circuit to the collectors of the third and fourth transistors Q3 and Q4.

A Lo signal is inputted to the base of the third transistor Q3 via the coupling capacitor Cb3. An IF signal is inputted to the base of the first transistor Q1 via the coupling capacitor Cb1. The base of the fourth transistor Q4 is connected to a ground potential via the capacitor Cb4. Similarly, the base of the second transistor Q2 is connected to the ground potential via the capacitor Cb2. The bases of the transistors Q1 to Q4 are connected to a well-known DC bias circuit (not shown). The DC bias circuit flows two kinds of current through the two cascaded transistor circuits, respectively.

An RF signal having the product information of the Lo signal and the IF signal is outputted from the node at which the collectors or drains of the third and fourth transistors Q3 and Q4 are connected to the load resistor Rc via the coupling capacitor Cc.

The capacitor C is, for example, a 10 pF capacitor. This capacitor C indicates an impedance $Z_{LO}$ of about 20 Ω at a frequency $f_{LO}$ (800 MHz) of the Lo signal. The capacitor C indicates an impedance $Z_{IF}$ of about 400 Ω at a frequency $f_{IF}$ (40 MHz) of the IF signal. As a result, the capacitor C becomes a low impedance at the frequency $f_{LO}$ of the Lo signal and a high impedance at the frequency $f_{IF}$ of the IF signal.

The capacitor C allows the third and fourth transistors Q3 and Q4 to act as a differential circuit for the Lo signal, and allows the first and second transistors Q1 and Q2 to act as a differential circuit for the IF signal.

In such a circuit configuration, when an Lo signal is inputted to the base of the third transistor Q3 via the coupling capacitor Cb3 while an IF signal is inputted to the base of the first transistor Q1 via the coupling capacitor Cb1, the capacitor C enables the third and fourth transistors Q3 and Q4 to work as a differential circuit for the Lo signal. At the same time, the capacitor C enables the first and second transistors Q1 and Q2 to work as a differential circuit for the IF signal. Two kinds of Miller current which are in an opposite phase to each other flow through the pair of transistors, respectively. In this case, since the current which flow through the first and third transistors Q1 and Q3 and the current through the second and fourth transistors Q2 and Q4 are the same in amount and in an opposite phase, they are canceled. The product components of the two kinds of Miller current are synthesized in the same phase. Thus, an RF signal including the product information of the Lo and IF signals is outputted from the node between the load resistor Rc and the collectors of the third transistor Q3 and the fourth transistor Q4 via the coupling capacitor Cc.

As described above, the multiplier includes a pair of the transistors Q1 and Q2 connected differentially to each other, a pair of the transistors Q3 and Q4 connected differentially to each other, a capacitor C acting as an impedance circuit connected between the transistor pairs, and a collector resistor Rc connected to the collectors of the transistor pair to form a signal outputting node. Hence, a high frequency multiplier can be realized by only a simplified configuration of four transistors Q1 to Q4. This feature can lead to miniaturization, low price, high performance, and low power consumption of the frequency converters, radio communication apparatuses, or the like embodied with the multiplier according to the invention.

Moreover, since a capacitor (electrostatic capacitance) C connected between the node at which the collector of the first transistor Q1 is connected to the emitter of the third transistor Q3 and the node at which the collector of the second transistor Q2 is connected to the emitter of the fourth transistor Q4 is used as an impedance circuit, it is easy to realize an integrated circuit fabrication.

As shown in FIG. 3, when an IF signal of a low frequency is inputted to the base of the third transistor Q3 while an Lo signal of a high frequency is inputted to the base of the first transistor Q1, an inductance L can be used as an impedance circuit connected between the node at which the collector of the first transistor Q1 is connected to the emitter of the third transistor Q3 and the node at which the collector of the second transistor Q2 is connected to the emitter of the fourth transistor Q4. In such a circuit configuration, the inductance L allows the third transistor Q3 and the fourth transistor Q4 to act as a differential circuit for an IF signal, and allows the first transistor Q1 and the second transistor Q2 to act as a differential circuit for an Lo signal. Two kinds of Miller current flow through the two cascaded transistor circuits, respectively. The two kinds of Miller current are in an opposite phase to each other. Thus, an RF signal including the product information of the Lo and IF signals is outputted from the node a which the resistor Rc is connected to the collectors of the third and fourth transistors Q3 and Q4, by way of the coupling capacitor Cc.

The circuit described above has the same effect and advantage as those in the embodiment shown in FIG. 2. The inductor L acting as an impedance circuit is suitable in the case where the high frequency multiplier is realized on a printed board because the impedance can be easily formed with a patterned wiring.

Figure 4:
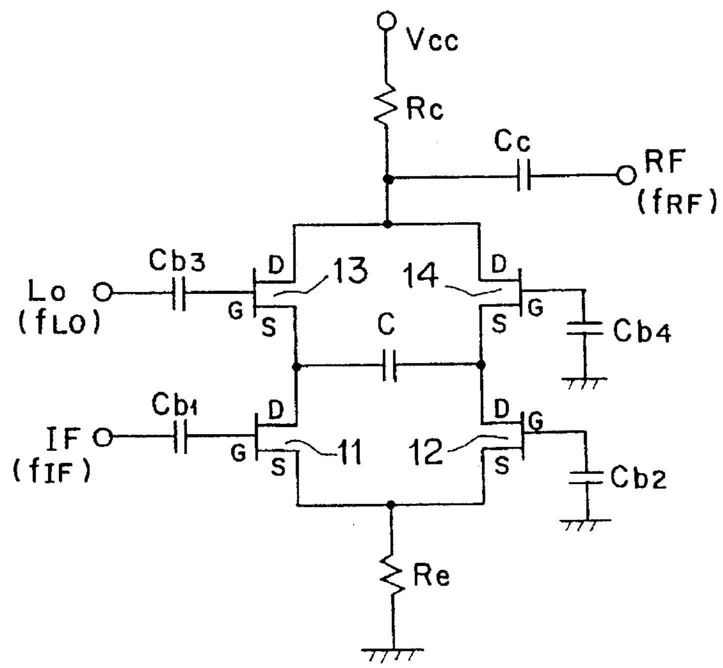
FIG. 4 is an electrical circuit showing a second modification of the first embodiment according to the present invention.
Figure 5:
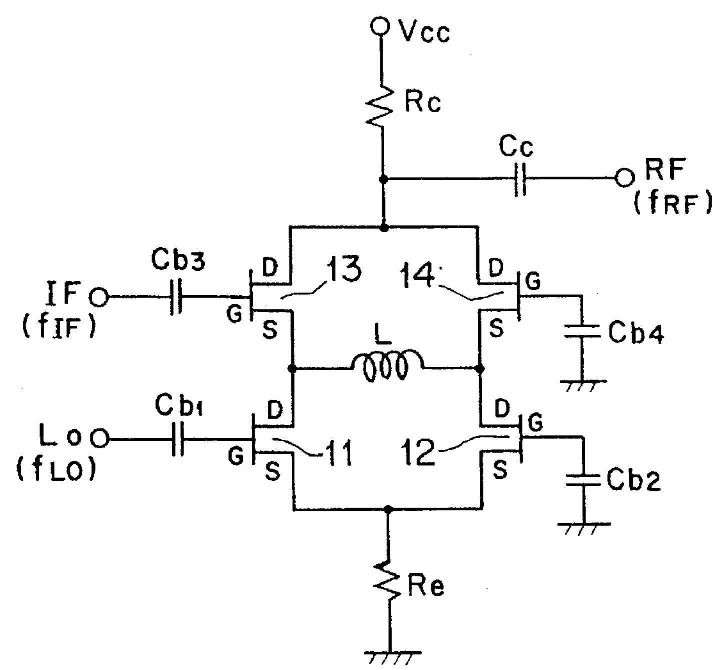
FIG. 5 is an electrical circuit showing a third modification of the first embodiment according to the present invention.

It is apparent that the circuits shown in FIGS. 2 and 3 can be realized using FETs (Field Effect Transistors). In this case, as shown in FIGS. 4 and 5, a resistor Re acting as a constant current source is connected to the sources of the first and second FETs 11 and 12. The drain of the first FET 11 is connected to the source of the third FET 13. The drain of the second FET 12 is connected to the source of the fourth FET 14.

The circuits shown in FIGS. 4 and 5, which utilize the FETs, employ an impedance circuit (a capacitor C as shown in FIG. 4 or an inductance L as shown in FIG. 5) which is connected between the node at which the drain of the first FET 11 and the source of the third FET 13 and the node at which the drain of the second FET 12 and the source of the fourth FET 14. A first input signal (corresponding to the Lo signal in FIG. 4 or the IF signal in FIG. 5) is inputted to the gates of the third and fourth FETs 13 and 14 while a second input signal (corresponding to the IF signal in FIG. 4 or the Lo signal in FIG. 5) is inputted to the gates of the first and second FETs. An output signal including product information of the first input signal and the second input signal is outputted from the node connected between the drains of the third and fourth FETs 13 and 14 and the resistor Rc. In the circuit configuration described above, the same effect as those of the embodiments in FIGS. 2 and 3 can be substantially offered and the characteristics of the FET allows a multiplier to work in higher frequency band.

Figure 6:
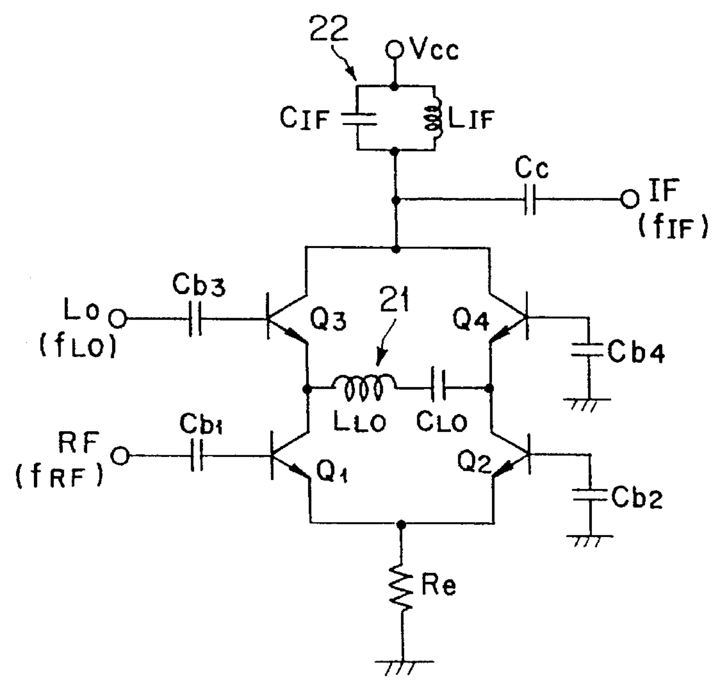
FIG. 6 is an electrical circuit showing the second embodiment according to the present invention.

(c) Explanation of Second Embodiment:

FIG. 6 is an electrical circuit diagram showing the second embodiment of the present invention. Referring to FIG. 6, the high frequency multiplier is used for a down-converter (a receiving frequency converter) in a radio receiver. When an RF signal of a frequency of $f_{RF}$ is inputted as a second input signal, together with an Lo signal of a frequency of $f_{LO}$ received as a first input signal, an IF signal of a frequency of $f_{IF}(=f_{RF}-f_{LO})$ is outputted as an output signal. For example, the frequency $f_{RF}$ of the RF signal is 900 MHz; the frequency $f_{LO}$ of the Lo signal is 800 MHz; and the frequency $f_{IF}$ of the IF signal is 100 MHz.

In order to realize the operation described above, the circuit configuration includes a pair of first and second transistors Q1 and Q2 connected to each other and a pair of third and fourth transistors Q3 and Q4 connected to each other.

A resistor Re acting as a constant current source is connected to the emitters of the first and second transistors Q1 and Q2. The collector of the first transistor Q1 is connected to the emitter of the third transistor Q3. The collector of the second transistor Q2 is connected to the emitter of the fourth transistor Q4.

A serial resonance circuit 21 (a serial circuit of an inductance $L_{LO}$ and a capacitor $C_{LO}$) acting as an impedance circuit Z, as shown in FIG. 6, is connected between the node at which the collector of the first transistor Q1 is connected to the emitter of the third transistor Q3 and the node at which the collector of the second transistor Q2 is connected to the emitter of the fourth transistor Q4.

A parallel resonance circuit 22 (a parallel circuit of an inductance $L_{IF}$ and a capacitor $C_{IF}$) acting as an impedance circuit is connected to the collectors of the third and fourth transistors Q3 and Q4.

An Lo signal is inputted to the base of the third transistor Q3 via the coupling capacitor Cb3. An RF signal is inputted to the base of the first transistor Q1 via the coupling capacitor Cb1. The base of the fourth transistor Q4 is grounded via the capacitor Cb4. The base of the second transistor Q2 is grounded via the capacitor Cb2. DC bias circuits well-known (not shown) are connected to the bases of the transistors. The DC bias circuit flows two kinds of current through the pair of transistors, respectively.

An IF signal including product information of an Lo signal and an RF signal is outputted from the node connecting the collectors of the third and fourth transistors Q3 and Q4 and the parallel resonance circuit 22 via the coupling capacitor Cc.

The serial resonance circuit 21 resonates at a frequency $f_{Lo}$ of the Lo signal. For example, in the serial resonance circuit 21, the capacitance $C_{Lo}$ is about 4 pF, the inductance $L_{Lo}$ is about 10 nH. The serial resonance circuit 21 exhibits a low impedance at a frequency $f_{Lo}$ of the Lo signal and exhibits a high impedance at a frequency $f_{RF}$ of the RF signal.

The parallel resonance circuit 22 resonates at a frequency $f_{IF}$ of the IF signal. For example, in the parallel resonance circuit 22, the capacitor $C_{IF}$ is about 39 pF and the inductance $L_{IF}$ is about 62 nH. This circuit configuration can output effectively an IF signal.

The serial resonance circuit 21 allows the third and fourth transistors Q3 and Q4 to work as a differential circuit for the Lo signal and allows the first and second transistors Q1 and Q2 to work as a differential circuit for the RF signal.

In the circuit configuration described above, when an Lo signal is inputted to the base of the third transistor Q3 via the coupling capacitor Cb3 while an RF signal is inputted to the base of the first transistor Q1 via the coupling capacitor Cb1, the serial resonance circuit 21 enables the third and fourth transistors Q3 and Q4 to act as a differential circuit for the Lo signal and enables the first and second transistors Q1 and Q2 to act as a differential circuit for the RF signal. Thus two kinds of Miller current in an opposite phase to each other flow through the transistor pairs. At this time, the current which flows through the first and third transistors Q1 and Q3 is the same in amount as that of the current which flows through the second and fourth Q2 and Q4, but are in an opposite phase to each other. Therefore, the two kinds of current are canceled. The product components are synthesized in the same phase. Thus, an IF signal including product information of the Lo signal and the RF signal is outputted from the node at which the collectors of the third and the fourth transistors Q3 and Q4 are connected the parallel resonance circuit 22 through the coupling capacitor Cc.

As described previously, a high frequency multiplier can be realized with a simplified circuit configuration of four transistors. This feature leads to miniaturization, low price, high performance, and low power consumption of frequency converters, radio communication apparatuses or the like employing the multiplier according to the invention.

Since the serial resonance circuit 21 acting as an impedance circuit which is connected between the node at which the collector of the first transistor Q1 is connected to the emitter of the third transistor Q3 and the node at which the collector of the second transistor Q2 is connected to the emitter of the fourth transistor Q4, a certain operation can be established even when two input signals used for a down-converter in a radio receiver have a close frequency to each other.

Figure 7:
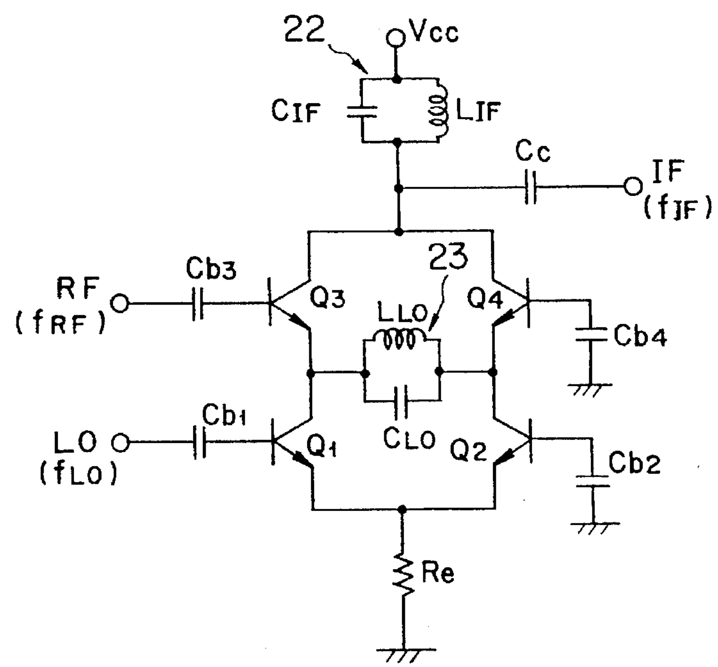
FIG. 7 is an electrical circuit showing a first modification of the second embodiment according to the present invention.

As described in FIG. 7, by inputting an RF signal to the base of the third transistor Q3 and a Lo signal to the base of the first transistor Q1, the parallel resonance circuit 23 (a parallel circuit of an inductance $L_{Lo}$ and a capacitor $C_{LO}$), which resonates at a frequency $f_{Lo}$ of the Lo signal, can be used as an impedance circuit Z that is connected to the node at which the collector of the first transistor Q1 is connected to the emitter of the third transistor Q3 and the node at which the collector of the second transistor Q2 is connected to the emitter of the fourth transistor Q4. Such a circuit configuration allows the parallel resonance circuit 23 to operate as a differential circuit for the Lo signal and allows the first and second transistors to operate as a differential circuit at the RF signal. Two kinds of Miller current flow through the transistor pair. An IF signal including product information of the Lo signal and RF signal is outputted via the coupling capacitor Cc from the node at which the collectors of the third and fourth transistors Q3 and Q4 are connected to the parallel resonance circuit 23. This circuit configuration has the same effect and advantage as that in the embodiment shown in FIG. 6.

Figure 8:
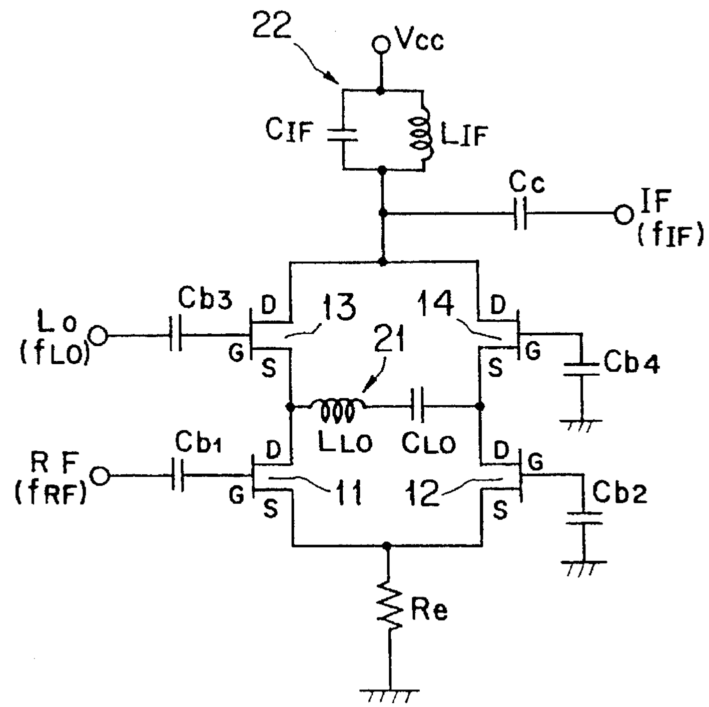
FIG. 8 is an electrical circuit showing a second modification of the second embodiment according to the present invention.
Figure 9:
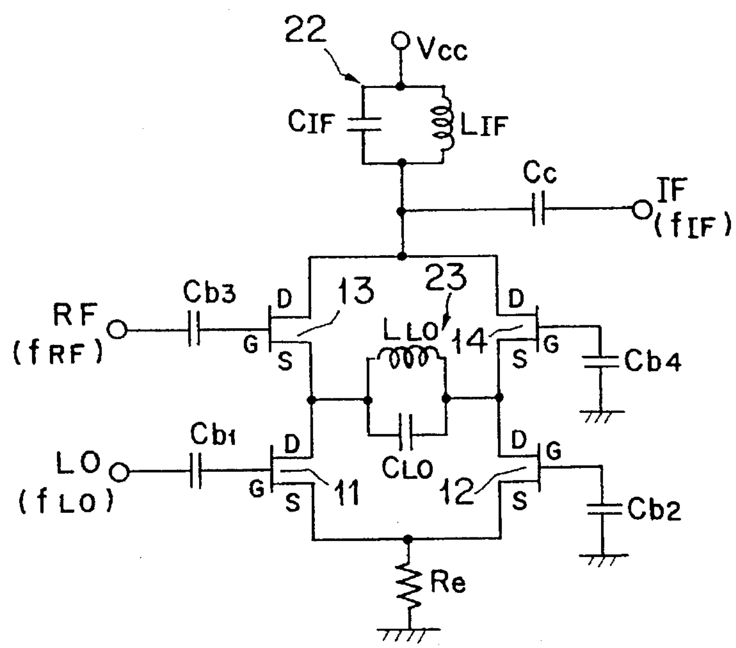
FIG. 9 is an electrical circuit showing a third modification of the second embodiment according to the present invention.

It is apparent that FETs can realize the multipliers shown in FIGS. 6 and 7. In this case, as shown in FIGS. 8 and 9, a resistor Re, which forms a constant current source, is connected to the sources of the first and second FETs 11 and 12. The drain of the first FET 11 is connected to the source of the third FET 13. The drain of the second FET 12 is connected to the source of the fourth FET 14.

The multipliers shown in FIG. 6 and 7, which utilize the FETs, employ an impedance circuit (a serial resonance circuit 21 as shown in FIG. 8 or a parallel resonance circuit 23 as shown in FIG. 9) which is connected between the node at which the drain of the first FET 11 is connected to the source of the third FET 13 and the node at which the drain of the second FET 12 is connected to the source of the fourth FET 14. A parallel resonance circuit 22 is connected to the drains of the third and fourth FETs 13 and 14. By inputting a first input signal (the Lo signal in FIG. 8 or the RF signal in FIG. 9) to the gates of the third and fourth FETs 13 and 14 and a second input signal (the RF signal in FIG. 8 or the Lo signal in FIG. 9) to the gates of the first and second FETs 11 and 12, an output signal including product information of the first input signal and the second input signal is outputted from the node at the drains of the third and fourth FETs 13 and 14 are connected to the parallel resonance circuit 22. The circuit configuration has substantially the same effect as that of each of the embodiments shown in FIGS. 6 and 7. The characteristics of the FET allows the multiplier to be used in higher frequency band.

Figure 10:
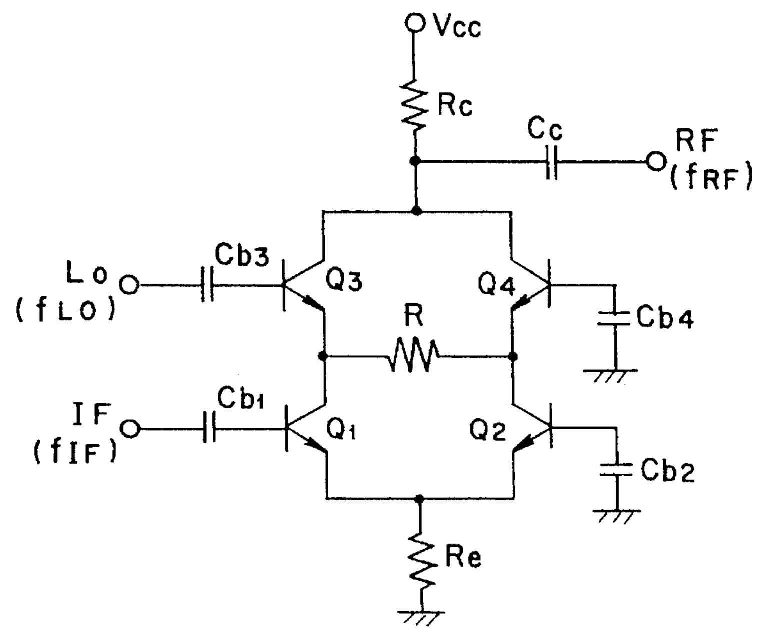
FIG. 10 is an electrical circuit diagram showing the third embodiment according to the present invention.

(d) Explanation of Third Embodiment:

As shown in FIG. 10, a resistor R, used as the impedance circuit Z, is connected between the node at which the collector of the first transistor Q1 is connected to the emitter of the third transistor Q3 and the node at which the collector of the second transistor Q2 is connected to the emitter of the fourth transistor Q4. This feature may degrade the circuit performance, in comparison with the second and third embodiments, but can realize a low manufacturing cost.

Figure 11:
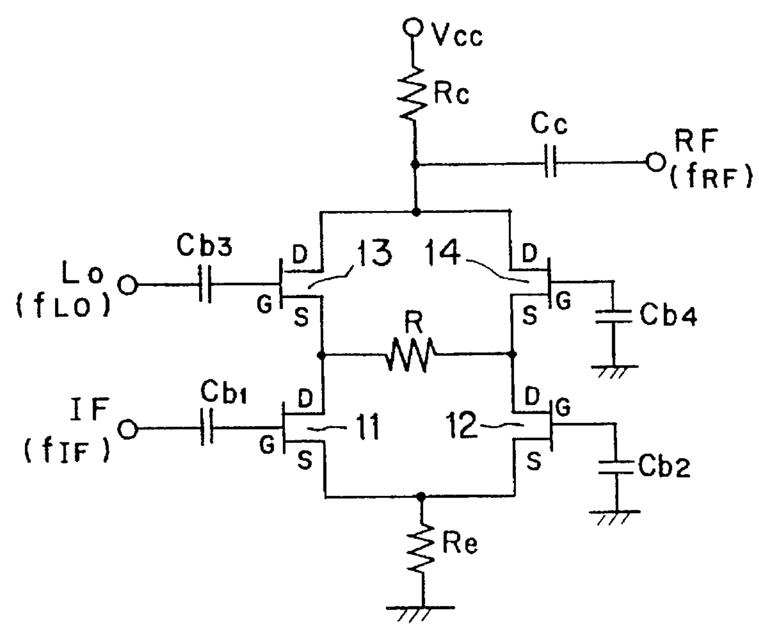
FIG. 11 is an electrical circuit diagram showing a first modification of the third embodiment according to the present invention.
Figure 12:
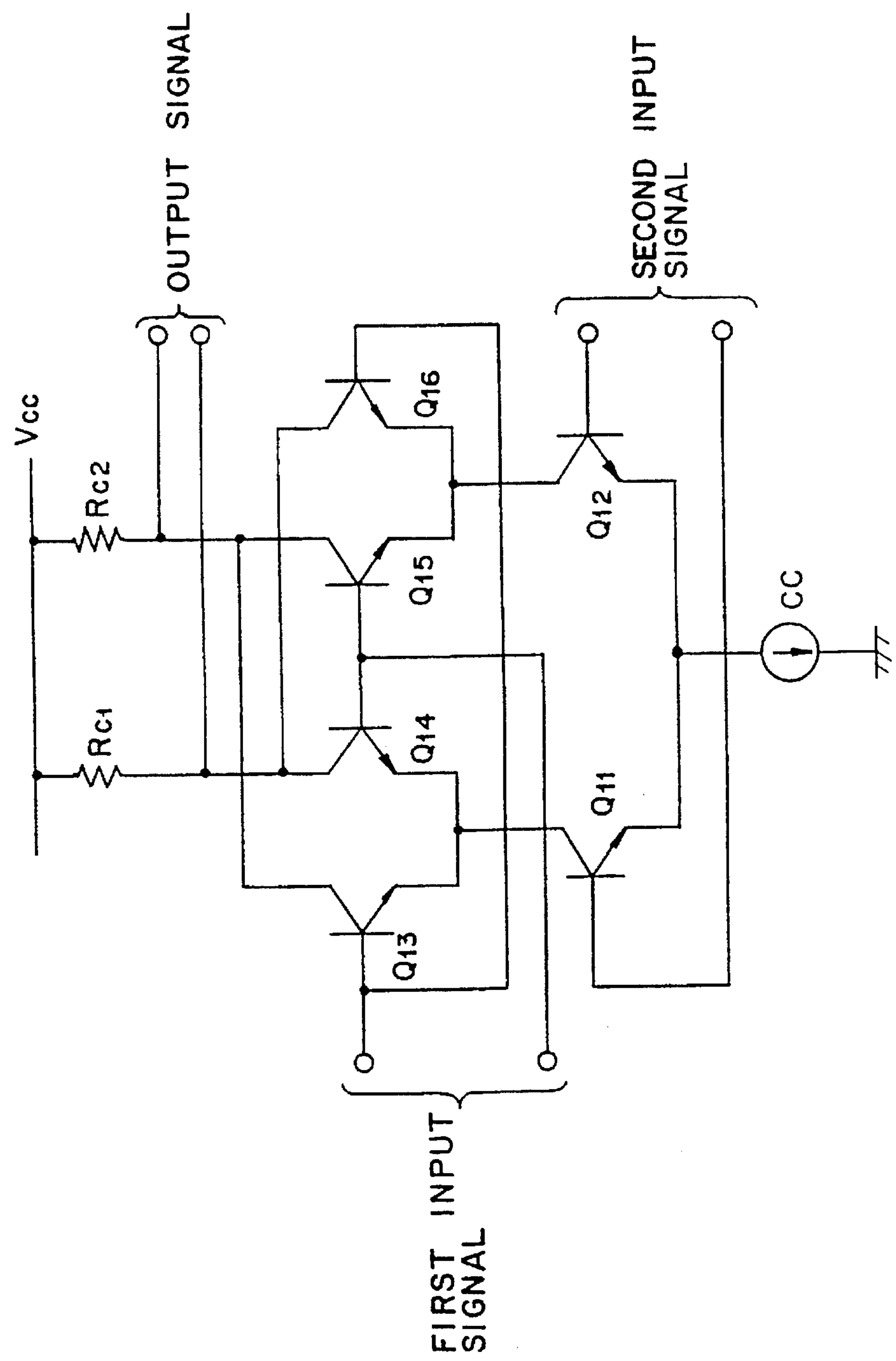
FIG. 12 is an electrical circuit diagram showing an example of a balanced input-type multiplier.

FETs can be used as the impedance circuit instead of a resistor. In this case, as shown in FIG. 11, a resistor, used as the impedance circuit Z, is connected between the node at which the drain of the first FET 11 is connected to the source of the third FET 13 and the node at which the drain of the second FET 12 is connected to the source of the fourth FET 14. This circuit structure allows the high frequency multiplier to be realized at a low manufacturing cost.

(e) Others:

In the first to third embodiments, an unbalanced input-type high frequency multiplier has been shown. However, it should be noted that the present invention is applicable for balanced input-type high frequency multipliers.

What is claimed is:

1. A high frequency multiplier, comprising:

a pair of first transistor and a second transistor which are connected differentially to each other;

a pair of third transistor and a fourth transistor which are connected differentially to each other;

a constant current source connected to emitters or sources of the first and second transistors, wherein said first transistors having a collector or drain connected to an emitter or source of said third transistor, and said second transistors having a collector or drain connected to an emitter or source of said fourth transistor;

an impedance circuit connected between a node at which the collector or drain of said first transistor is connected to the emitter or source of said third transistor and a node at which the collector or drain of said second transistor is connected to the emitter or source of said fourth transistor; and a load impedance circuit connected to the collectors or drains of said third and fourth transistors, said third or fourth transistor receiving a first input signal at the base or gate, and said first or second transistor receiving a second input signal at the base or gate, wherein an output signal having product information of said first input signal and said second input signal is outputted from said node at which the collectors or drains of said third and fourth transistors are connected to said load impedance circuit.

2. A high frequency multiplier according to claim 1, wherein said impedance circuit exhibits a low impedance at a frequency of said first input signal and exhibits a high impedance at a frequency of said second input signal.

3. A high frequency multiplier according to claim 2, wherein said impedance circuit exhibits a capacitance when said second input signal has a frequency lower than that of said first input signal.

4. A high frequency multiplier according to claim 2, wherein said impedance circuit exhibits an inductance when said first input signal has a frequency lower than that of said second input signal.

5. A high frequency multiplier according to claim 2, wherein said impedance circuit comprises a serial resonance circuit that resonates at a frequency of said first input signal.

6. A high frequency multiplier according to claim 2, wherein said impedance circuit comprises a parallel resonance circuit that resonates at a frequency of said second input signal.

7. A high frequency multiplier according to claim 1, wherein said impedance circuit comprises a resistor.

* * * * *